(12) United States Patent
Kawasaki

(10) Patent No.: US 7,888,713 B2
(45) Date of Patent: Feb. 15, 2011

(54) SEMICONDUCTOR DEVICE AND MANUFACTURING METHOD THEREOF

(75) Inventor: Hisao Kawasaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 11/839,180

(22) Filed: Aug. 15, 2007

(65) Prior Publication Data

US 2008/0067562 A1   Mar. 20, 2008

(30) Foreign Application Priority Data

Sep. 15, 2006   (JP) .............................. 2006-250928

(51) Int. Cl.
 *H01L 29/76* (2006.01)
(52) U.S. Cl. .................. 257/289; 257/77; 257/192; 257/194; 257/774; 257/E21.597; 257/E23.011; 257/E29.119
(58) Field of Classification Search .................. 257/77, 257/192, 194, 289, E21.597, E23.011, E29.119
See application file for complete search history.

(56) References Cited

U.S. PATENT DOCUMENTS

| | | | |
|---|---|---|---|
| 4,537,654 A * | 8/1985 | Berenz et al. ............... | 438/176 |
| 5,539,255 A | 7/1996 | Cronin | |
| 5,663,101 A | 9/1997 | Cronin | |
| 6,475,889 B1 | 11/2002 | Ring | |
| 6,611,002 B2 | 8/2003 | Weeks et al. | |
| 7,276,421 B2 | 10/2007 | Kim et al. | |
| 2003/0116791 A1 | 6/2003 | Baptist et al. | |
| 2008/0206989 A1 * | 8/2008 | Kruger et al. ............... | 438/667 |

FOREIGN PATENT DOCUMENTS

| | | |
|---|---|---|
| JP | 11-45892 | 2/1999 |
| JP | 2003-258002 | 9/2003 |
| KR | 1997-0018088 | 4/1997 |
| KR | 2002-0093901 | 12/2002 |
| KR | 2003-0044449 | 6/2003 |
| KR | 10-2006-0007093 | 1/2006 |
| KR | 10-2006-0040460 | 5/2006 |

* cited by examiner

*Primary Examiner*—Andy Huynh
(74) *Attorney, Agent, or Firm*—Oblon, Spivak, McClelland, Maier & Neustadt, L.L.P.

(57) ABSTRACT

A semiconductor device includes a substrate including a compound semiconductor, a semiconductor layer formed on a surface of the substrate and a constituent of the semiconductor layer including a nitride semiconductor different from a constituent of the substrate, a via hole provided in the substrate and configured to extend from a rear surface side of the substrate to the semiconductor layer, a ground electrode formed on an inner wall of the via hole, a contact layer provided in the semiconductor layer and configured to extend from a surface of the semiconductor layer to the ground electrode, a gate electrode and a drain electrode, each of which being formed on the semiconductor layer, and a source electrode formed on the semiconductor layer and connected to the ground electrode through the contact layer.

7 Claims, 3 Drawing Sheets

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2006-250928 filed on Sep. 15, 2006, the entire contents of which are incorporated herein by reference.

BACKGROUND OF THE INVENTION

1. Field of the Invention

The present invention relates to a semiconductor device such as a field effect transistor used as, for example, a high-frequency power amplifying device and manufacturing method thereof.

2. Description of the Related Art

In recent years, with advance in power of a high-frequency semiconductor element, high frequency characteristics and reliability in a field effect transistor (to be referred to as a Field Effect Transistor: abbreviated as an FET hereinafter) are required to be improved.

In particular, a nitride-based group-III-V compound semiconductor (to be referred to as GaN-based semiconductor hereinafter) which contains GaN as a principal constituent attracts attention with having a high saturation electron velocity and a high breakdown voltage. In order to apply excellent characteristics held by the GaN-based semiconductor to a device, a reduction in parasitic impedance, especially, source inductance in mounting is important.

In general, in a conventional semiconductor device such as a GaAs-based semiconductor device, by a method of connecting a source electrode to a ground electrode through a via hole, a reduction in source inductance is achieved. For example, as described in paragraph [0026] in Japanese Patent Application Laid-Open No. 2003-258002, a GaAs semiconductor layer is formed on a GaAs substrate, and a source electrode, a gate electrode, and a drain electrode are formed on a surface of the GaAs semiconductor layer. Via holes reaching the source electrode are formed in the GaAs substrate and the GaAs semiconductor layer by continuous etching. The source electrode is connected to a ground electrode formed on a rear surface of the GaAs substrate through the via hole.

In order to apply the method of reducing source inductance by forming a via hole to a GaN-based semiconductor, a SiC substrate used as a substrate of the GaN-based semiconductor layer must be etched. RIE (Reactive Ion Etching) method using a fluorine-based gas is used for the SiC substrate. However, a selectivity of the SiC substrate to the GaN-based semiconductor is large. Therefore, it is disadvantageously difficult to process the SiC substrate in the same manner as that in use of a GaAs substrate.

SUMMARY OF THE INVENTION

According to one aspect of the present invention, a semiconductor device includes a substrate including a compound semiconductor, a semiconductor layer formed on a surface of the substrate and a constituent of the semiconductor layer including a nitride semiconductor different from a constituent of the substrate, a via hole provided in the substrate and configured to extend from a rear surface side of the substrate to the semiconductor layer. The semiconductor device also includes a ground electrode formed on an inner wall of the via hole, a contact layer provided in the semiconductor layer and configured to extend from a surface of the semiconductor layer to the ground electrode, a gate electrode and a drain electrode, each of which being formed on the semiconductor layer, and a source electrode formed on the semiconductor layer and connected to the ground electrode through the contact layer.

According to one aspect of the present invention, a method of manufacturing a semiconductor device begins by forming a semiconductor layer including a nitride semiconductor on a substrate including a compound semiconductor, a constituent of the semiconductor layer different from a constituent of the substrate, and further forming a contact extending from a semiconductor layer side to the substrate. The method continues by forming a via hole extending from a substrate side to the contact and further forming a ground electrode connected to the contact on an inner wall of the via hole.

It is to be understood that both the forgoing general description and the following detailed description are exemplary and explanatory only and are not restrictive of the invention, as claimed.

BRIEF DESCRIPTION OF THE DRAWINGS

The accompanying drawings, which is incorporated in and constitute a part of this specification, illustrates an embodiment of the invention and together with the description, serve to explain the principles of the invention.

DETAILED DESCRIPTION OF THE EMBODIMENTS

Reference will now be made in detail to the present embodiment of the invention, an example of which is illustrated in the accompanying drawing. Wherever possible, the same reference numbers will be used throughout the drawings to refer to the same or like parts.

An embodiment of the present invention will be described below with reference to the accompanying drawings.

Figure 1:
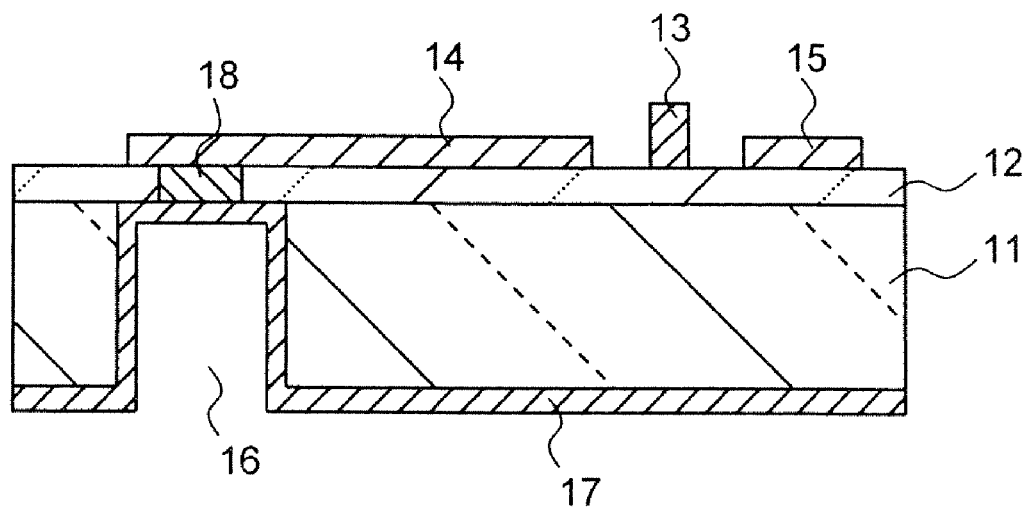
FIG. 1 is a sectional view of an FET element according to one embodiment of the present invention.

FIG. 1 is a sectional view of an FET element serving as a semiconductor device according to the embodiment. As shown in FIG. 1, a semiconductor layer 12 consisting of, for example, GaN is formed on a SiC substrate 11. A gate electrode 13, a source electrode 14, and a drain electrode 15 are formed on a surface of the semiconductor layer 12. A via hole 16 reaching the semiconductor layer 12 is formed in the substrate 11. A ground electrode 17 is formed on an inner wall of the via hole 16 and a rear surface of the substrate 11. In the semiconductor layer 12, a contact 18 for connecting the source electrode 14 and the ground electrode 17 is formed.

Figure 2:
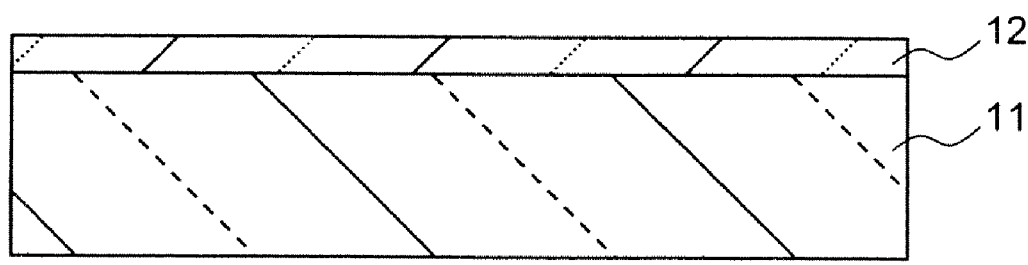
FIGS. 2 to 4 are views showing steps in manufacturing the FET element in FIG. 1.
Figure 3:
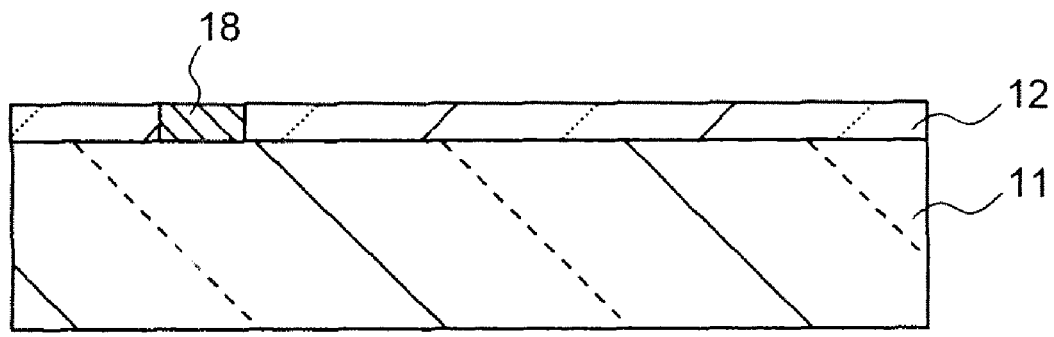

The semiconductor device is formed as follows. As shown in FIG. 2, the semiconductor layer 12 is formed on the substrate 11. As shown in FIG. 3, for example, simultaneously with an element isolation step, in a predetermined region of the semiconductor layer 12, a contact hole extending from the surface of the semiconductor layer 12 to the substrate 11 is formed by RIE using, for example, a $Cl_2$ gas. The contact hole is filled with a metal layer containing, for example, Ni or Al to form the contact 18.

Figure 4:
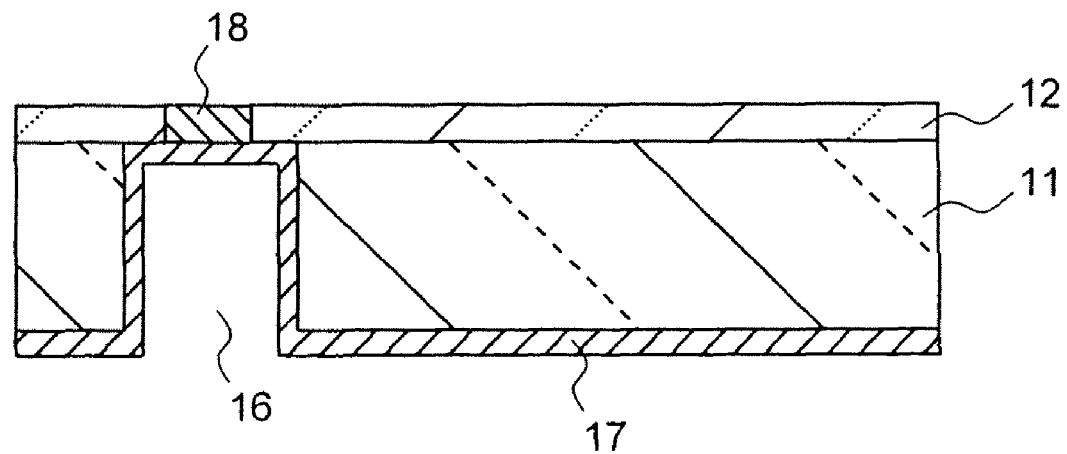

As shown in FIG. 4, the via hole 16 is formed in the substrate 11 by RIE using a fluorine-based gas such as $SF_6$ or $CF_4$ to reach the semiconductor layer 12 and the contact 18. On the inner wall of the via hole 16 and the rear surface of the substrate 11, the ground electrode 17 including an Au layer having a thickness of, for example, about several micrometers is formed.

Furthermore, after an active element region (not shown) is formed, the source electrode 14 connected to the contact 18 and the drain electrode 15 are formed on the surface of the semiconductor layer 12, and the gate 13 electrode is formed between the source electrode 14 and the drain electrode 15. An Au layer may be formed on the source electrode 14 and the drain electrode 15. In this manner, an FET element as shown in FIG. 1 is formed.

With this configuration, each source electrode 14 is connected to the ground electrode 17 through the contact 18 to make it possible to reduce a source inductance. For example, simultaneously with an element isolation step, a contact hole can be formed in the semiconductor layer 12. Therefore, the via hole 16 is formed without requiring a complex process such as exchange of etching gases when the semiconductor layer 12 is exposed. When the via hole 16 is formed by RIE using a fluorine-based gas, a selectivity of the substrate 11 to the semiconductor layer 12 can be made sufficiently high. For this reason, the semiconductor layer 12 can be used as a stopper layer.

Figure 5:
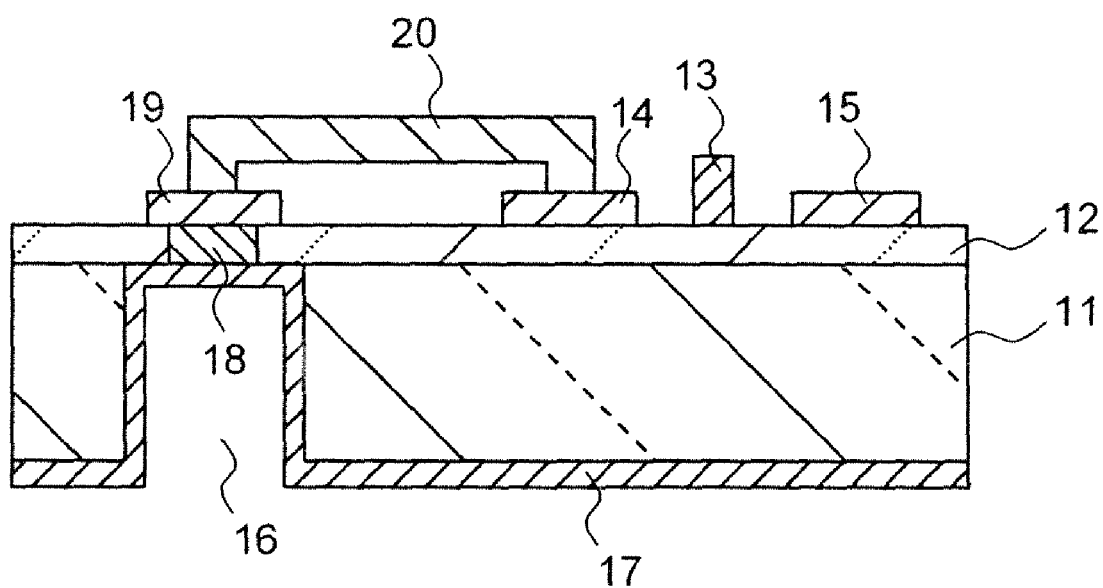
FIG. 5 is a sectional view of an FET element according to one embodiment of the present invention.

The via hole 16 needs not be connected to the source electrode 14 through the contact 18 in the active element region. As shown in FIG. 5, the via hole 16 and the contact 18 may be formed outside the active element region, and may be connected to the source electrode 14 through an electrode 19 by an air bridge 20.

The GaN layer is used as a semiconductor layer, any nitrogen-based semiconductor layer can be used. In addition to a GaN-based single layer film, an AlGaN-based single layer film, an AlN-based single layer film, and a laminated layer film including a GaN-based layer, an AlGaN-based layer and AlN-based layer, such as a GaN/AlGaN/AlN/SiN film can be used.

The configuration is used in an FET element such as a HEMT (High Electron Mobility Transistor), a MESFET (Metal Semiconductor Field Effect Transistor), and a MOSFET (Metal oxide semiconductor field effect transistor). These FET elements are applied to a monolithic microwave integrated circuit including the FET elements as constituent elements. The monolithic microwave integrated circuit is used as, for example, a high frequency semiconductor device or a power conversion apparatus.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device comprising:
   a substrate including a compound semiconductor;
   a semiconductor layer formed on a surface of the substrate, a constituent of the semiconductor layer including a nitride semiconductor different from a constituent of the substrate;
   a via hole provided in the substrate and configured to extend from a rear surface side of the substrate to the semiconductor layer;
   a ground electrode formed on an inner wall of the via hole;
   a contact layer provided in the semiconductor layer, the contact layer being configured to extend from a surface of the semiconductor layer to the ground electrode, the contact layer comprising a metal layer independent of the ground electrode, and a base level of the contact layer being at a same level as an interface of the substrate and the semiconductor layer;
   a gate electrode and a drain electrode, each of which being formed on the semiconductor layer, and
   a source electrode formed on the semiconductor layer and on the contact layer, and connected to the ground electrode through the contact layer.

2. The semiconductor device according to claim 1, wherein the ground electrode is further formed on the rear surface of the substrate.

3. The semiconductor device according to claim 1, wherein the substrate includes a SiC substrate.

4. The semiconductor device according to claim 1, wherein the semiconductor layer includes a GaN-based semiconductor layer.

5. The semiconductor device according to claim 1, wherein the via hole is formed immediately below the source electrode.

6. The semiconductor device according to claim 1, wherein the via hole is arranged away from a position immediately below the source electrode.

7. The semiconductor device according to claim 1, wherein the contact layer and the source electrode are connected by an air bridge.

* * * * *